United States Patent [19]

Meyer et al.

[11] Patent Number: 5,789,931
[45] Date of Patent: Aug. 4, 1998

[54] QUANTITATIVE MOBILITY SPECTRUM ANALYSIS FOR MAGNETIC FIELD DEPENDENT HALL AND RESISTIVITY DATA

[75] Inventors: Jerry R. Meyer, Catonsville; Craig A. Hoffman, Columbia; Filbert J. Bartoli, Upper Marlboro, all of Md.; Jaroslaw Antoszewski, Thornlie; Lorenzo Faraone, Mount Lawley, both of Australia

[73] Assignee: The United States of America as represented by the Secretary of the Navy, Washington, D.C.

[21] Appl. No.: 539,182

[22] Filed: Oct. 4, 1995

[51] Int. Cl.$^6$ .................................................. G01R 31/26
[52] U.S. Cl. ........................... 324/765; 324/251; 324/719
[58] Field of Search .................................. 324/251, 719, 324/765

[56] References Cited

U.S. PATENT DOCUMENTS

| | | | |
|---|---|---|---|
| 4,087,745 | 5/1978 | Kennedy, Jr. et al. | 324/642 |
| 4,857,839 | 8/1989 | Look et al. | 324/752 |

OTHER PUBLICATIONS

J. Antoszewski et al., "Magneto–Transport Characterization Using Quantitative Mobility–Spectrum Analysis," Extended Abstracts, 1994 U.S. Workshop on the Physics and Chemistry of Mercury Cadmium Telluride and other IR Materials, pp. 137–140, San Antonio, TX, Oct. 4, 1994.

H. Brugger et al, "Variable Field Hall Technique: A New Characterization Tool for HFET/MODFED Device Wafers," III–Vs, vol. 8, pp. 41–45, (month unavailable) 1995.

J. Antoszewski et al., Magneto–Transport Characterization Using Quantitative Mobility–Spectrum Analysis, J. Electronic Materials vol. 24, p. 1255 (No. 9, Sep., 1995).

Meyer et al., Advanced Magneto–Transport Characterization of LPE–Grown $Hg_{1-x}Cd_xTe$ by QMSA, Abstract for HgCdTe Workshop (Oct., 1995).

W.A. Beck and J.R. Anderson, Determination of Electrical Transport Properties Using a Novel magnetic Field–Dependent Hall Technique, J. Applied Physics 62(2), p. 541 (Jul. 15, 1987).

Z. Dziuba et al., Analysis of the Electrical Conduction Using an Iterative Method, J. Phys. III France, vol. 2, p. 99 (Jan., 1992).

C.A. Hoffman et al., Negative Energy Gap in HgTe–CdTe Heteros–structure with Thick Wells, Physical Review B, vol. 40, p. 3867 (No. 6, Aug. 15, 1989).

J.C. Meyer et al., Methods for Magnetotransport Characterization of IR Detector Materials, Semiconductor Science Technology, vol. 8, p. 804 (1993) (Month Unavailable).

T.C. Harmon et al., Hall Coefficient and Transverse Magnetoresistance in HgTe at 4.2 °K and 77°K, J. Phys. Chem. Solids, vol. 28, p. 1995 (Pergamon Press, Mar. 1967).

J.S. Kim et al., Multicarrier Characterization Method for Extracting Mobilities and Carrier Densities of Semiconductors from Variable Magnetic Field Measurements, J. Appl. Physics, vol. 73, p. 8324 (No. 12, Jun. 15, 1993).

(List continued on next page.)

*Primary Examiner*—Ernest F. Karlsen
*Assistant Examiner*—Russell M. Kobert
*Attorney, Agent, or Firm*—Thomas E. McDonnell; Edward F. Miles

[57] ABSTRACT

A method and apparatus for producing the conductivity-mobility spectrum of an isotropic semiconductor material, and hence infer the mobility and concentration of carriers in the material. Hall voltage and material conductivity are measured at a plurality of magnetic field strengths, values of the spectrum estimated for each field strength, and the estimates numerically iterated to produce convergent values for the spectrum. In one embodiment, interim selected values of the spectrum are prevented from going negative, which increases the precision of the ultimate convergent values. In another embodiment, the iteration equations employ damping factors to prevent over-correction from one iteration to the next, thus preventing convergent instabilities. The preferred iteration is the Gauss-Seidel recursion.

7 Claims, 5 Drawing Sheets

OTHER PUBLICATIONS

J.R. Lowney et al., Transverse Magnetoresistance: A Novel Two–Terminal Method for Measuring the Carrier Density and Mobility of a Semiconductor Layer, Applied Physics Letters, vol. 64, p. 3015 (No. 22, May 30, 1994).

S.E. Schacham et al., Mixed Carrier Conduction in Modulation–Dop–ed Field Effect Transistors, Applied Physics Letters, vol. 67, p. 2031 (No. 14, Oct. 2, 1995).

R.K. Willardson et al., Transverse Hall and Magnetoresistance Effects in p–Type Germanium, Physical Review, vol. 96, p. 1512 (No. 6, Dec. 15, 1954).

Z. Dziuba, Mobility Spectrum Analysis of the Electrical Conduction, Acta Physica Polonica A, vol. 80 (No. 6, 1991) (Month Unavailable).

QUANTITATIVE MOBILITY SPECTRUM ANALYSIS FOR MAGNETIC FIELD DEPENDENT HALL AND RESISTIVITY DATA

BACKGROUND

Mixed-conduction effects quite often have a strong influence on the magneto-transport properties of semiconductor materials, including bulk samples, thin films, quantum wells, and processed devices. Multiple species due to majority and minority carriers in the active region, intentional n and p doping regions as well as unintentional doping non-uniformities along the vertical axis, localization in multiple active regions, carriers populating buffer layers and substrates, populations at surfaces and interface layers, and carriers populating different conduction band minima or valence band maxima (e.g.,$\Gamma$, X, and L valley electrons) tend to contribute simultaneously to the conduction in real materials of interest to industrial characterization and process control, and to research investigations of novel materials and phenomena. Standard measurements of the resistivity and Hall coefficient at a single magnetic field are of limited use when applied to systems with prominent mixed-conduction, since they provide only averaged values of the carrier concentration and mobility, which are not necessarily representative of any of the individual species. Far more information becomes available if one performs the magneto-transport experiments as a function of magnetic field, because in principle one can then use the data to obtain densities and mobilities for each carrier present. The motion of carriers in a Hall sample may be described by the following set of equations:

$$J_x = \sigma_{xx} E_x + \sigma_{xy} E_y$$

$$J_y = \sigma_{yx} E_x + \sigma_{yy} E_y$$

where $E_x$ and $E_y$ are the electric field components along the x and y directions, $J_x$ and $J_y$ are the resulting current densities, and for a material which is isotropic in the x-y plane, $\sigma_{xx} = \sigma_{yy}$, and $\sigma_{xy} = -\sigma_{yx}$. The experimental Hall coefficient RH and resistivity $\rho$ are related to the components of the conductivity tensor through the relations $$R_H(B) = \frac{\sigma_{xy}/B}{\sigma_{xx}^2 + \sigma_{xy}^2}$$

and $$\rho(B) = \frac{\sigma_{xx}}{\sigma_{xx}^2 + \sigma_{xy}^2}$$

where B is the magnetic field applied along the z axis. For a sample containing more than one type of carrier, the conductivity tensor components can be expressed as a sum over the I species present within the multi-carrier system:

$$\sigma_{xx} = \sum_{m=1}^{M} \frac{n_m e \mu_m}{1 + \mu_m^2 B^2}$$

$$\sigma_{xy} = \sum_{m=1}^{M} \frac{S_m n_m e \mu_m^2 B}{1 + \mu_m^2 B^2}$$

Here $n_m$ and $\mu_m$ are the concentration and mobility of the m-th carrier species, and $S_m$ is +1 for holes and −1 for electrons. It is primarily the $[1+(\mu_m B_m)^2]$ terms in the denominators which differentiate the contributions by the various carrier species. The contributions due to higher-mobility carriers are the first to be "quenched" as B is increased, i.e., a given species exerts far less influence on $R_H(B)$ and $\rho(B)$ once $\mu_m B \gg 1$. This phenomenon provides the field-dependent Hall data with their high degree of sensitivity to the individual mobilities.

Traditionally, the conventional technique for analyzing magnetic-field-dependent Hall data is the Multi-Carrier Fitting procedure, a procedure whereby the above equations for $\sigma_{xx}$ and $\sigma_{xy}$ are employed to fit experimental data for $R_H(B)$ and $\rho(B)$. In this method, $n_i$ and $\mu_i$ are the fitting parameters and the number of carriers I is typically between 1 and 5. The main drawback of the Multi-Carrier Fitting is its arbitrariness. One must not only make prior assumptions about the approximate densities and mobilities of the various electron and hole species, but a decision must also be made in advance with respect to what type and how many carriers to assume. Injudicious guesses can lead to misleading or ambiguous results, and the fit to the experimental Hall data is not unique.

In order to overcome this shortcoming, Beck and Anderson (BA) proposed an approach known as the Mobility Spectrum Analysis in which an envelope of the maximum conductivity is determined as a continuous function of mobility. The various electron and hole species then appear as peaks in the mobility spectrum. Allowing for the existence of a continuous distribution of hole-like and electron-like carriers of any mobility, the above expressions for $\sigma_{xx}$ and $\sigma_{xy}$ may be rewritten in integral form:

$$\sigma_{xx}(B) = \int_0^\infty d\mu \frac{s^p(\mu) + s^n(\mu)}{1 + \mu^2 B^2}$$

$$\sigma_{xy}(B) = \int_{-\infty}^\infty d\mu \frac{[s^p(\mu) - s^n(\mu)]\mu B}{1 + \mu^2 B^2},$$

where the hole and electron conductivity density functions (i.e., the mobility spectra) are $s^p(\mu)$ and $s^n(\mu)$ are the hole and electron density functions. However, while the goal is to find $s^p(\mu)$ and $s^n(\mu)$, these are not uniquely defined by the measured $\sigma_{xx}(B)$ and $\sigma_{xy}(B)$. Given values for the conductivity tensor at 2I different magnetic fields define a 2I-dimensional space which has, at most, 2I independent basis vectors. Since Beck and Anderson's integral expressions for $\sigma_{xx}$ and $\sigma_{xy}$ represent an expansion of the data in terms of an infinite basis, the expansion cannot be unique. Using a rather complex mathematical formalism, Beck and Anderson instead obtained unique envelopes $s^n(\mu)$ and $s^p(\mu)$ which represent physical $\delta$-like (impulse-like) amplitudes at $\mu$. While this is not as valuable as finding unique $s^n(\mu)$ and $s^p(\mu)$, it is still useful in that the various carrier species may usually be identified from the peaks in the envelope spectrum. A major advantage of the mobility spectrum analysis over the Multi-Carrier Fitting is that it is non-arbitrary, i.e., no prior assumptions are required. The derived spectrum may thus be viewed as simply a mathematical restatement of the original experimental Hall data. It is also computer automated, and provides a visually-meaningful output format. However, the significant disadvantage is that the information obtained is primarily qualitative rather than quantitative, in that one does not actually obtain a fit to the experimental Hall and resistivity data.

In 1988, Meyer et al. developed a Hybrid Mixed Conduction Analysis (HMCA), which was extensively tested between 1988 and 1994. In that method, the Beck and Anderson mobility spectrum is used to determine the number of carrier species and roughly estimate their densities and mobilities, and the Multi-Carrier Fitting is then used to obtain a final quantitative fit. However, a degree of arbitrariness is still present in making decisions based on the Beck and Anderson spectra, the multi-carrier fits do not always converge (e.g., the "best" fit may be obtained with one of the species having a density approaching infinity and a mobility approaching zero), and the results can be expressed only in terms of a discrete number of species with discrete mobilities. These difficulties effectively prevent full computer automation of some stages of the procedure. Brugger and Koser have more recently discussed a similar approach, which suffers from the same limitations.

A different mobility spectrum was recently proposed by Dziuba and Gorska. Their goal was more ambitious than that of Beck and Anderson, namely to quantitatively derive the actual mobility distribution instead of just an upper-bound envelope. In their approach, the integrals appearing in the conductivity tensor expressions for $\sigma_{xx}$ and $\sigma_{xy}$ corresponding to the integral expressions of Beck and Anderson, which are approximated by sums of the partial contributions by carriers having a grid of discrete mobilities, $$\sigma_{xx}(B_j) = \sum_{i=1}^{N} \frac{S_i^{\sigma} \Delta \mu_i}{1 + \mu_i^2 B_j^2}$$

$$\sigma_{xy}(B_j) = \sum_{i=1}^{N} \frac{S_i^{\eta} \mu_i B_j \Delta \mu_i}{1 + \mu_i^2 B_j^2},$$

where the partial conditions are defined as:

$$S_i^{\sigma} = s^p(\mu_i) + s^n(\mu_i)$$

$$S_i^{\eta} = s^p(\mu_i) - s^n(\mu_i)$$

The parameter I defines both the number of points i in the final mobility spectrum and the number of magnetic fields j at which pseudo-data points $\sigma_{xx}(B_j)$ and $\sigma_{xy}(B)$ are satisfied by the model. Interpolation is used to obtain the pseudo-data points from the actual experimental data, $\sigma_{xx}$ and $\sigma_{xy}$ (quantities derived from $R_H$ and $\rho$), which were measured at a much smaller number of fields B. Using an initial trial spectrum (much simpler than the Beck and Anderson spectrum), Dziuba and Gorska solved the set of equations:

$$\sigma_{xx}(B_j) = \sum_{i=1}^{N} \frac{S_i^{\sigma} \Delta \mu_i}{1 + \mu_i^2 B_j^2}$$

$$\sigma_{xy}(B_j) = \sum_{i=1}^{N} \frac{S_i^{\eta} \mu_i B_j \Delta \mu_i}{1 + \mu_i^2 B_j^2},$$

using the Jacobi iterative procedure, in which the transformation matrix elements $1/(\mu_i B_i)^2$ and $\mu_i B_j/(\mu_i B_i)^2$ are simplified because of the specific choice of mobility points $\mu_i = 1/B_i$ in the $s^p(\mu_i)$ and $s^n(\mu_i)$ spectra. An important consequence of this specific choice of mobility points is that the mobility range in the spectrum is limited to $\mu_{min} \leq \mu \leq \mu_{max}$. Here $\mu_{min} = 1/B_{max}$, $\mu_{max} = 1/B_{min}$ are the minimum and maximum magnetic fields employed in the experiment, respectively. Mobility of carriers in samples of practical interest quite often lie outside this range. The goal of the procedure is to find those 2I variables $s^p(\mu_i)$ and $s^n(\mu_i)$ which solve the 2I equations in the system represented by (9 & 10) Each equation in the system describes the model's success in reproducing one pseudo-data point $\sigma_{xx}(B_j)$ or $\sigma_{xy}(B_j)$. "Nonphysical" results are allowed, in that negative values of $s^p(\mu_i)$ and $s^n(\mu_i)$ are obtained for some regions of the spectra. Specifically, because the Dziuba and Gorska approach uses 2I parameters to fit 2I equations, the solution is inherently unstable, in that small perturbations in the input data lead to large changes in the parameters obtained. As a consequence, it tends to be unreliable with regard to repeatedly reproducing meaningful results.

SUMMARY OF THE INVENTION

Accordingly, it is an object of this invention to remedy the above mentioned deficiencies of the prior art. In accordance with this and other objects made apparent hereinafter, the invention concerns an apparatus and method effective for identifying the conductivity-mobility spectrum of a semiconductor material. The sample is sequentially exposed to a plurality I of preselected magnetic fluxes $B_i$, i=1, 2, . . . . , I; and, for each said $B_i$, the Hall coefficient $R_{H(i)}$ and electrical resistivity $\rho_i$ corresponding to the $B_i$ are measured. These measurements are used to determine elements $\sigma_{xx(i)}$ and $\sigma_{xy(i)}$ of the conductivity tensor of the sample at the corresponding $B_i$'s. The values of $\sigma_{xx(i)}$ and $\sigma_{xy(i)}$ are used to make estimates of the magnitudes $S_{xx(i)}$ and $S_{xy(i)}$ of the conductivity-mobility spectrum of the sample. The estimates are then iterated mathematically to optimize their values. During the iteration, should any value of $S_{xx(i)}$ become negative, it is set to a preselected non-negative value, preferably zero.

These and other objects are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

Figures 1A, 2:
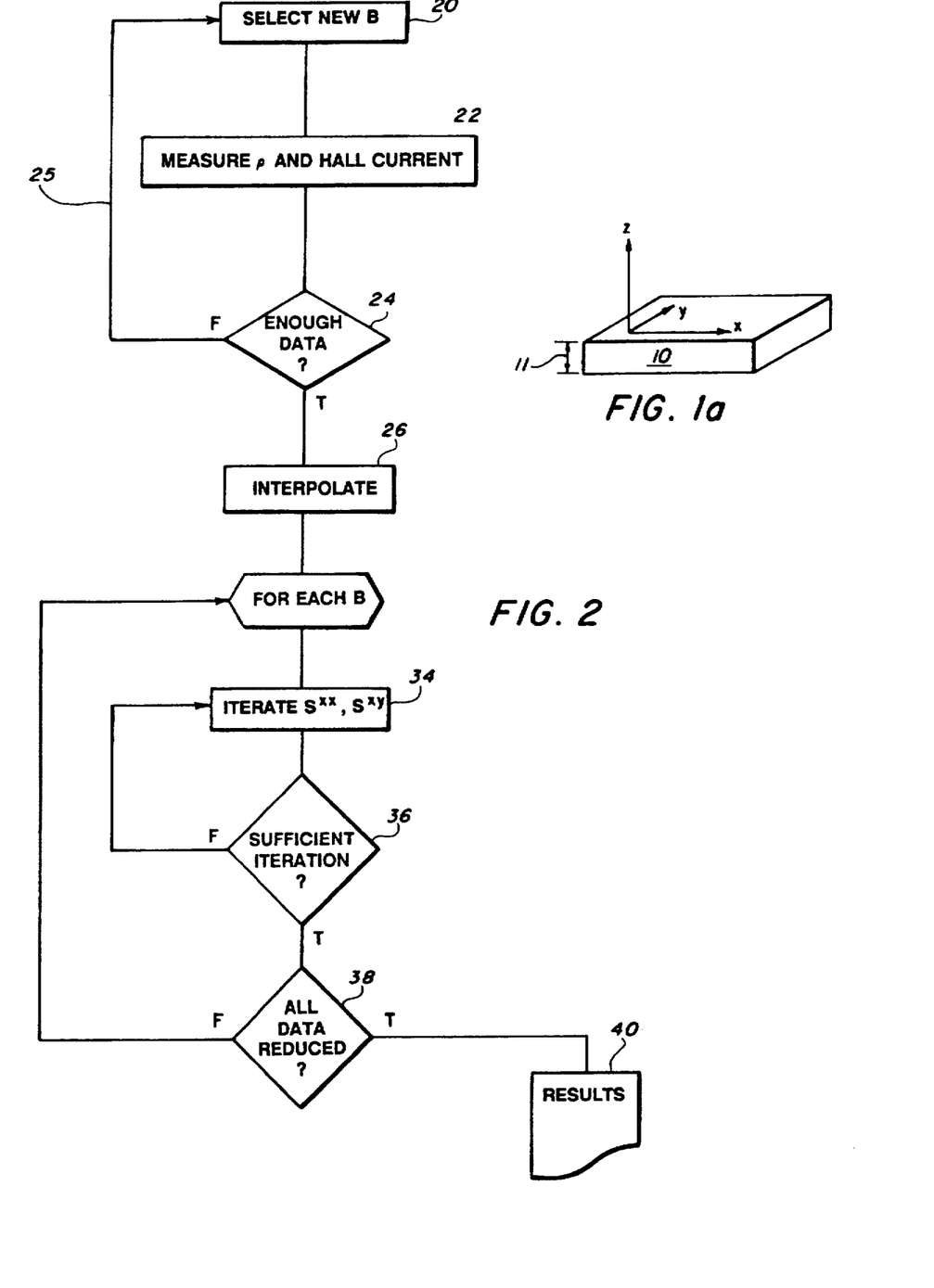
FIG. 1a is an isometric view of a material sample suitable for processing by the invention, and which illustrates geometrical relationships relevant to the invention.
FIG. 2 is a flow diagram illustrating an embodiment of the invention.

With reference to the drawing figures, wherein like references indicate similar structure or steps throughout the several views, FIG. 1a illustrates a sample of material 10 to be tested in accordance with the invention. Sample 10 is disposed generally along three orthogonal directions x, y, and z, with a substantially planar face in the x-y plane, and a thickness 11 in the z direction small compared to the size of sample 10 in the x-y plane. Practice of the invention assumes that thickness 11 be this small, as does each of the prior art techniques discussed above, to ensure that current leakage and power dissipation in the z direction is negligible. Sample 10 can be of any material which has a finite electrical resistivity ($\rho$), and sufficient carrier mobility and magnetic permeability to have a significant Hall effect. Most preferably, sample 11 would be a semiconductor chip, for example one of many such chips on an automated testing/ assembly line which employs the invention to automatically characterize a large batch of chips.

Figure 1B:
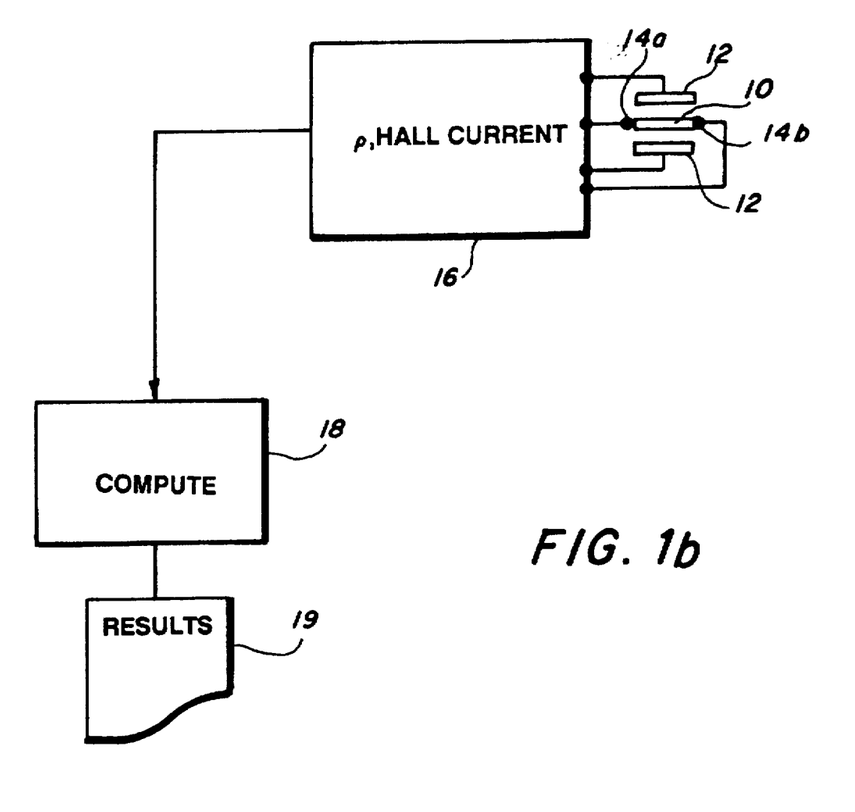
FIG. 1b is a schematic of an apparatus according to the invention.
Figure 1C:
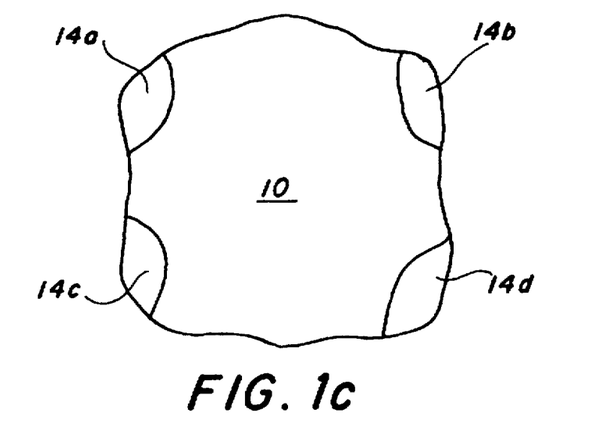
FIG. 1c is a schematic illustrating the electrical connections necessary to make Hall and conductivity measurements.

FIG. 1b shows schematically an apparatus according to the invention. Member 16 is any conventional device to measure resistivity and Hall voltage, and such apparatus are well known in the art, and commonplace. Sample 10 has four contacts 14a, 14b, 14c, and 14d which permit measurement of the resistivity and Hall voltage as a function of a uniform magnetic field applied by member 12. Such measurements are conventional and well known, and per se form no part of the invention. For that reason they are not discussed further. Member 12 is adjustable to permit the taking of such measurements at different selected magnetic field intensities. Measurements taken by device 16 are transferred to member 18, preferably a digital computer, for recordation and reduction, and the results ultimately output to member 19, which is preferably a digital storage medium (e.g. a magnetic disk), or any convenient display medium, such as a computer monitor, or a simple printout.

FIG. 2 shows a method according to the invention for characterizing a sample such as 10. A particular magnetic flux intensity is chosen, and directed uniformly across sample 10 in the z direction (20) as discussed above in connection with FIG. 1b. The Hall voltage induced in sample 10 is measured in the x and y plane (22), as well as material resistivity, again in accordance with well known principles. These measurements are repeated a number of times (25) for different selected magnetic fields (25) until one has taken sufficient data (24). In principle, one could practice the invention with data from very few magnetic field values, although as with any characterization technique, the more data one takes, the more detailed will be the information which can be obtained. Preferably, one artificially generates additional data points by interpolating between measured values of resistivity and Hall current (26). In principle, if one has M discrete carrier species present in sample 10, one can practice the invention effectively with resistivity and Hall data generated at M different magnetic fluxes. In practice, one generally does not know how many carriers are present, or their range of mobilities. One would typically obtain much more reliable information with data generated by 2I different magnetic fluxes, and no less than 10. Preferably the minimum non-zero field should be no less than $B_{min}=(\mu_{max})^{-1}$, where $\mu_{max}$ is the highest mobility species one would expect in sample 10, and the maximum field should be at least $B_{max}=(\mu_{min})^{-1}$, where $\mu_{min}$ is the lowest mobility species. However, this is often impractical because very low fields are difficult to calibrate, and very high fields are unattainable with most Hall measurement systems. Preferably one should employ the largest and smallest magnetic fields available and acquire data for 10 to 15 field spanning that range, with a logarithmic division of the range between $B_{min}$ and $B_{max}$. The Hall characterization analysis is generally insensitive to carriers with mobilities greater than $10(B_{min})^{-1}$ or less than $(B_{min})^{-1}/10$.

The data are reduced point by point for each value of magnetic field (30), (34). Taking the corresponding measured Hall coefficient $R_H$ and resistivity $\rho$, one calculates the values of the conductivity tensor $\sigma$ using the prior art equations given above:

$$R_H(B)=(\sigma_{xy}/B)/[(\sigma_{xx})^2+(\sigma_{xy})^2]$$

$$\rho(B)=\sigma_{xx}/[(\sigma_{xx})^2+(\sigma_{xy})^2]$$

One then uses the technique of Beck and Anderson, discussed above, to convert the values of the tensor $\sigma$ into starting values for $S^{xy}_i$, and $S^{xx}_i$, where i indicates data corresponding to the ith mobility value $\mu_i$ of I total values, i=1, . . . , I. Having done so, one rearranges the equations of Dzuba and Gorska to solve for $S^{xx}$ and $S^{xy}$, i.e.:

$$S_i^{xx} = (1+\mu_i^2 B_i^2)\left[\sigma_{xx}^{exp}(B_i) - \sum_{j\neq i}^{m} \frac{S_j^{xx}}{1+\mu_j^2 B_i^2}\right]$$

$$S_i^{xy} = \frac{(1+\mu_i^2 B_i^2)}{\mu_i B_i}\left[\sigma_{xy}^{exp}(B_i) - \sum_{j\neq i}^{m} \frac{S_j^{xy}\mu_j B_i}{1+\mu_j^2 B_i^2}\right].$$

where $B_i=1/\mu_i$. One then proceeds to iterate these equations to gain values of $S^{xx}$ and $S^{xy}$ which best fit the measured data. This is preferably done using a Gauss-Seidel iteration method, i.e. using the following recursion:

$$S_i^{xx}(k+1) =$$

$$(1+\mu_i^2 B_i^2)\left[\sigma_{xx}^{exp}(B_i) - \sum_{j=1}^{i-1}\frac{S_j^{xx}(k+1)}{1+\mu_j^2 B_i^2} - \sum_{j=i+1}^{m}\frac{S_j^{xx}(k)}{1+\mu_j^2 B_i^2}\right]$$

$$S_i^{xy}(k+1) =$$

$$\frac{(1+\mu_i^2 B_i^2)}{\mu_i B_i}\left[\sigma_{xy}^{exp}(B_i) - \sum_{j=1}^{i-1}\frac{S_j^{xy}(k+1)\mu_j B_i}{1+\mu_j^2 B_i^2} - \sum_{j=i+1}^{m}\frac{S_j^{xy}(k)\mu_j B_i}{1+\mu_j^2 B_i^2}\right]$$

in which k is an index corresponding to iteration number. Thus for the first iteration, one uses estimate values of $S^{xx}$ and $S^{xy}$, e.g. those produced by the Beck and Anderson approach (i.e. $S^{xx}(0)$ and $S^{xy}(0)$) to produce $S^{xx}(1)$ and $S^{xy}(k1)$, and more generally $S^{xx}(k+1)$ and $S^{xy}(k+1)$ result from values of $S^{xx}(k)$ and $S^{xy}(k)$, etc. Thus as soon as an updated value of $S^{xx}$ or $S^{xy}$ is calculated by one of these equations, it is inserted into the other equation, and in this manner produces further updated values. This proceeds for a set number of iterations, or until the updated values of $S^{xx}$ and $S^{xy}$ stabilize within preset bounds. The process is repeated for all the data, i.e. I times, to generate a corresponding number of values for $S^{xx}$ and $S^{xy}$ for each mobility $\mu_i$, i.e. $S^{xx}_1, S^{xy}_2, \ldots, S^{xx}_I, S^{xy}_I$. Experience has shown that 100 iterations is usually sufficient.

Sometimes the amount by which the values of $S^{xx}$ and Sxy are corrected from one iteration to another can be greater than the amount by which $S^{xx}$ and $S^{xy}$ differ from their ultimate stable values. This over compensation can cause successive iterations to oscillate, and is preferably compensated for by introducing damping factors $\omega_x$ and $\omega_y$ such that:

$$S_i^{xx}(k+1) = (1-\omega_x)S_i^{xx}(k) + \quad (18)$$

$$\omega_x\left[(1+\mu_i^2 B_i^2)\left[\sigma_{xx}^{exp}(B_i) - \sum_{j=1}^{i-1}\frac{S_j^{xx}(k+1)}{1+\mu_j^2 B_i^2} - \sum_{j=i+1}^{m}\frac{S_j^{xx}(k)}{1+\mu_j^2 B_i^2}\right] - S_i^{xx}(k)\right]$$

and $$S_i^{xy}(k+1) = (1-\omega_y)S_i^{xy}(k) +$$

$$\omega_y\left[\frac{(1+\mu_i^2 B_i^2)}{\mu_i B_i}\left[\sigma_{xy}^{exp}(B_i) - \sum_{j=1}^{i-1}\frac{S_j^{xy}(k+1)\mu_j B_i}{1+\mu_j^2 B_i^2} - \sum_{j=i+1}^{m}\frac{S_j^{xy}(k)\mu_j B_i}{1+\mu_j^2 B_i^2}\right] - S_i^{xy}(k)\right].$$

The effect of $\omega_x$ and $\omega_y$ is to reduce the amount of by which $S^{xx}$ and $S^{xy}$ are corrected from one iteration to another, slowing rate of convergence, but also stabilizing the iteration. Typically, $\omega_x$ and $\omega_y$ are much less than 1, preferably $\omega_x=0.03$ and $\omega_y=0.003$.

Figure 3:
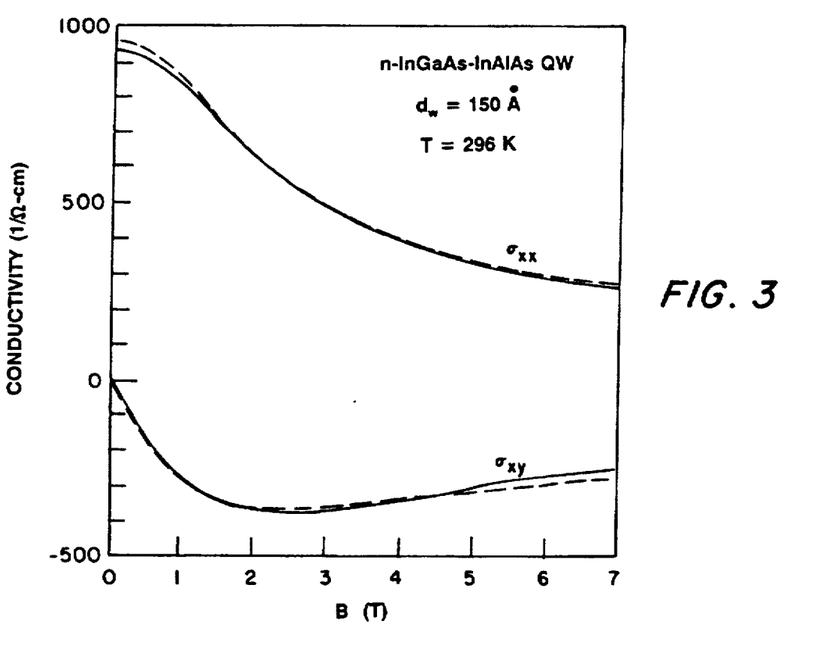
FIGS. 3–8 are graphs presenting and contrasting experimental data, and generated by embodiments of the invention
Figure 4:
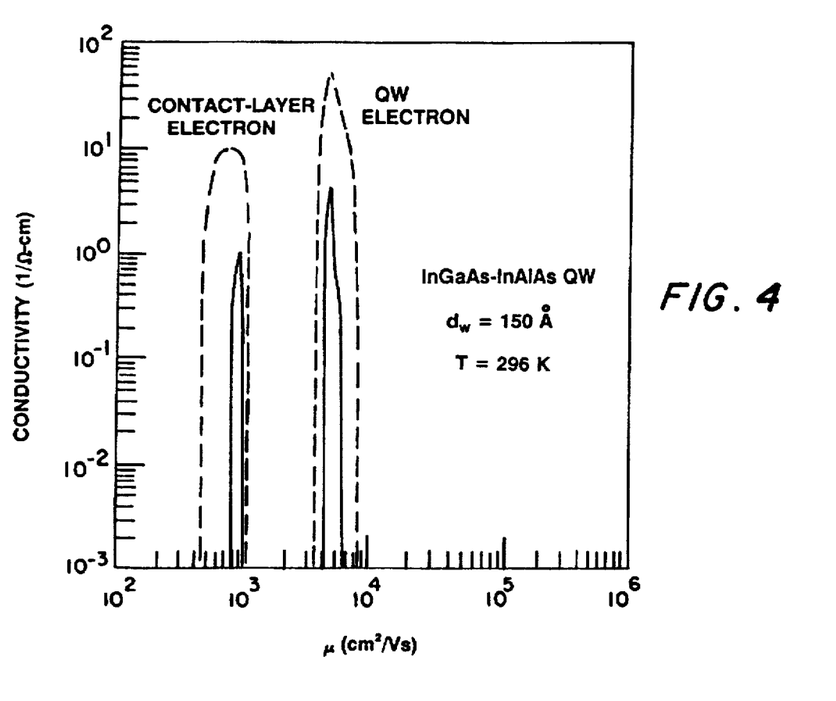

FIGS. 3–4 show data generated according to the invention on a sample formed into a quantum well. The quantum well was a semiconductor monilith grown upon an InP substrate oriented in the <100> direction. Atop the substrate was a buffer layer of InGaAs/InAlAs, followed by an undoped 2500 Å thick barrier layer of InAlAs, and a 150 Å undoped InGaAs well layer. Atop the well layer was an undoped barrier of InAlAs 100 Å thick, and a planar doping layer of silicon which supplied carriers to the well, a further undoped layer of InAlAs 300 Å thick, and a cap layer of InAlAs 300 Å thick p domed to $3(10)^{18} \text{cm}^{-3}$.

In FIG. 3 the dashed lines represent a data fit produced by the invention, and the solid lines represent the same information obtained experimentally. The good agreement between the two confirms that the iteration produces electron and hole mobility spectra whose values of the conductivity tensor as a function of magnetic flux are nearly the same as measured data.

FIG. 4 shows the conductivity spectrum ($\sigma$ against $\mu$) using the values of $\sigma_{xx}$ and $\sigma_{xy}$ in FIG. 3, with the dashed lines indicating the electron mobility spectrum $s^n(\mu)$, and the solid lines the hole mobility spectrum $s^p(\mu)$. The spectra in FIG. 4 show two conductivity peaks at mobilities of 4600 cm$^2$/Volt-sec, and 710 cm$^2$/Volt-sec, indicating two carrier species in the structure. These are attributable to electrons in the quantum well (higher mobility), and electrons in the cap layer (lower mobility).

Figure 5:
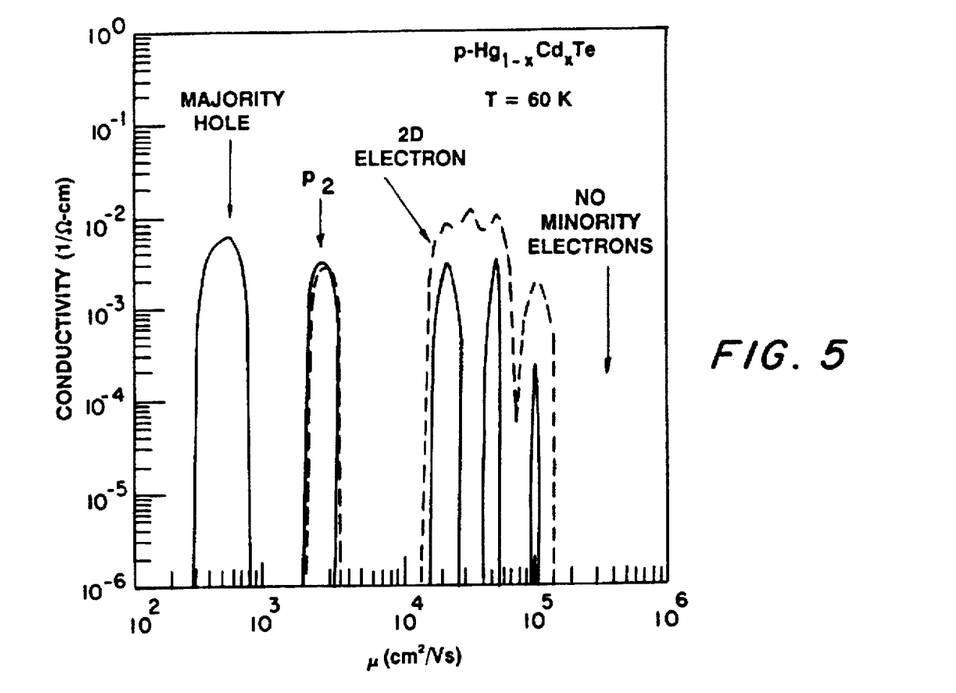
Figure 6:
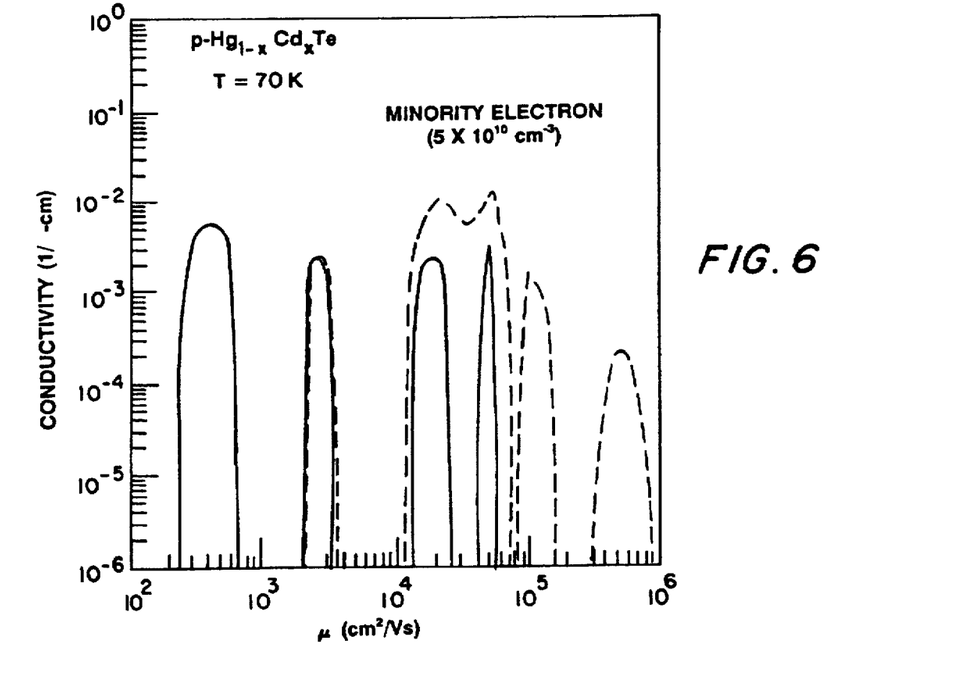

FIG. 5–6 show, for 60° K. and 70° K. respectively, a similar plot of hole (solid lines) and electrons (dashed lines) mobility spectra for a p-doped sample of epitaxial Hg$_{1-x}$Cd$_x$Te on a CdTe substrate, with x=0.213 calculated according to the invention. In this case, four different carrier species were observed, which are attributable to majority holes (p), minority electrons (n), surface electrons (n$_2$), and holes residing at the interface of the substrate and the epitaxial layer. The thermally generated minority electrons appeared very abruptly when the temperature increased from 60° K. and 70° K. This was as expected, and demonstrated the sensitivity of the invention to very low electron concentrations.

Figure 7:
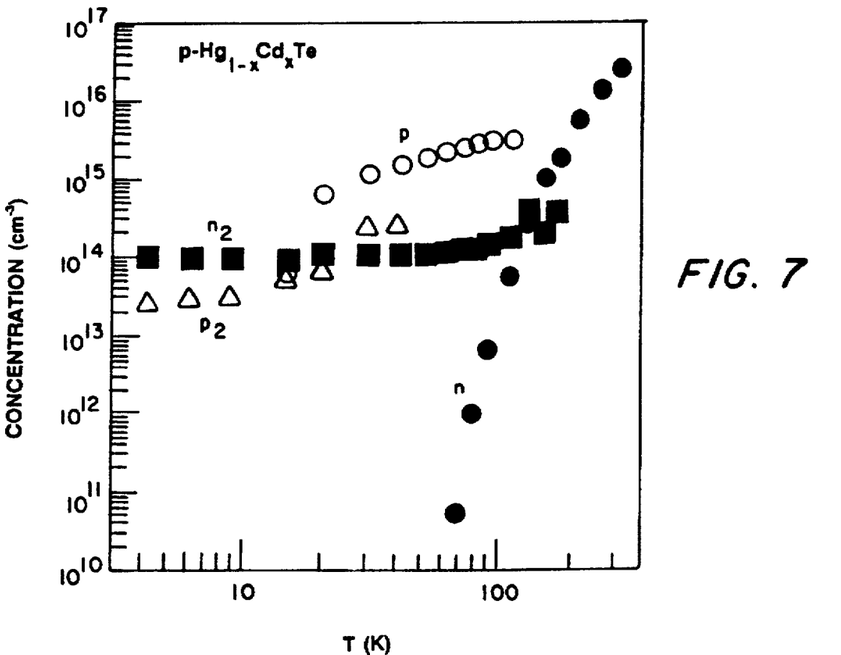
Figure 8:
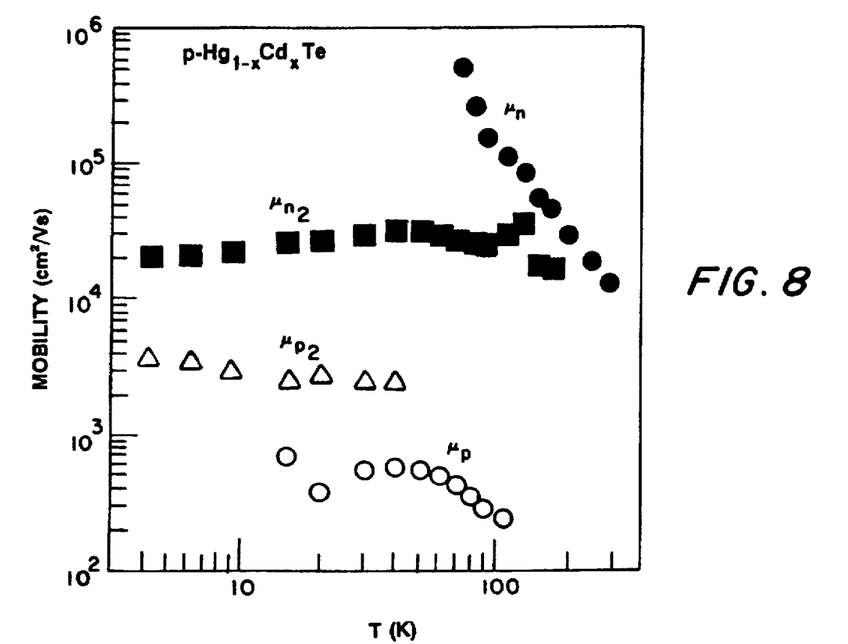

Data like that of FIGS. 5–6 were taken of an extended temperature range, and the carrier information gotten thereby is summarized in FIGS. 7–8 in the form of total carriers, and carrier mobility, as a function of temperature. Open circles represent majority holes, filled circles represent minority electrons, filled boxes represent surface electrons, and open triangles represent interface holes. As seen in the figures, the temperature variances were reasonable, regular, and generally as expected, further confirming the validity of the invention.

The invention permits extension of the mobility range considered by Dziuba and Gorska by more than an order of magnitude in each direction, to values greater than $1/B_{min}$, and less than $1/B_{max}$, through interpolation and extrapolation of the experimental data to values beyond those actually measured. The manner of extrapolation to high fields is particularly critical, since it must employ data acquired at $\mu B < 1$ to reproduce the known high-field asymptotic forms at $\mu B \gg 1$. The method employed in the invention is to take $\sigma_{xx}(B)$ and $\sigma_{xy}(B)$ for fields greater than $B_{max}$ to have functional forms consistent with $$\sigma_{xx} = \sum_{i=1}^{m} \frac{n_i e \mu_i}{1 + \mu_i^2 B^2}$$

-continued $$\sigma_{xy} = \sum_{i=1}^{m} S_i \frac{n_i e \mu_i^2 B}{1 + \mu_i^2 B^2}.$$

above, and which satisfy the condition-that they smoothly join the magnitudes and first-derivatives of the experimental conductivity tensor components at $B_{max}$. Extension of the mobility limits beyond the restricted values considered by Dziuba and Gorska is quite important in general, since the mobilities of some of the carrier species of greatest interest in real semiconductor devices often fall outside the range $1/B_{max} < \mu < 1/B_{min}$, and it is known that the magnetotransport data can in fact be quite sensitive to the properties of those carriers.

The invention has been described in what is considered to be the most practical and preferred embodiments. It is recognized, however, that obvious modifications to these embodiments may occur to those with skill in this art. For example, all of the calculations above described are preferably done on an electronic computer programmed to the task. This permits quick and automatic processing of large amounts of data, and adapts the invention especially well to the needs of, e.g. an assembly line in a semiconductor factory. But although preferred, the invention is by no means limited to such a computer, the invention comprehends any kind of calculator which can take initial Hall and conductivity data, and reduce it as described herein. In this light, the scope of the invention is discerned from the appended claims, wherein:

We claim:

1. A method comprising:
   providing an isotropic sample of semiconductor material;
   sequentially exposing said sample to a plurality I of preselected magnetic fields $B_i$, i=1, 2, . . . , I; and
   for each said $B_i$:
   (a) measuring the Hall coefficient $R_{H(i)}$ and electrical resistivity $\rho_i$ corresponding to said $B_i$;
   (b) using said $R_{H(i)}$, said $\rho_i$, and said $B_i$ to determine elements $\sigma_{xx(i)}$ and $\sigma_{xy(i)}$ of the conductivity tensor of said sample at said $B_i$;
   (c) using said $\sigma_{xx(i)}$ and $\sigma_{xy(i)}$ to make estimates of the magnitudes $S_{xx(i)}$ and $S_{xy(i)}$ of the conductivity-mobility spectrum of said sample;
   wherein said method further comprises:
   using said $B_i$'s, said $\sigma_{xx(i)}$'s and $\sigma_{xy(i)}$'s, and said estimates of $S_{xx(i)}$ and $S_{xy(i)}$ for mathematically iterating the values of $S_{xx(i)}$ and $S_{xy(i)}$;
   wherein said iterating is done effective to cause, upon any value of said $S_{xx(i)}$ becoming negative, to reset said $S_{xx(i)}$ to a preselected non-negative value.

2. An apparatus comprising:
   means for providing an isotropic sample of semiconductor material;
   means for sequentially exposing said sample to a plurality I of preselected magnetic fields $B_i$, i=1, 2, . . . , I; and
   means, for each said $B_i$, for:
   (a) measuring the Hall coefficient $R_{H(i)}$ and electrical resistivity p, corresponding to said $B_i$;
   (b) using said $R_{H(i)}$, said $\rho_i$, and said $B_i$ to determine elements $\sigma_{xx(i)}$ and $\sigma_{xy(i)}$ of the conductivity tensor of said sample at said $B_i$;
   (c) using said $\sigma_{xx(i)}$ and $\sigma_{xy(i)}$ to make estimates of the magnitudes $S_{xx(i)}$ and $S_{xy(i)}$ of the conductivity-mobility spectrum of said sample;
   wherein said apparatus further comprises:

means for using said $B_i$'s, said $\sigma_{xx(i)}$'s and $\sigma_{xy(i)}$'s, and said estimates of $S_{xx(i)}$ and $S_{xy(i)}$ for mathematically iterating the values of $S_{xx(i)}$ and $S_{xy(i)}$;

wherein said iterating is done effective to cause, upon any value of said $S_{xx(i)}$ becoming negative, to reset said $S_{xx(i)}$ to a preselected non-negative value.

3. A method comprising:

providing an isotropic sample of semiconductor material;

sequentially exposing the sample to a plurality I of preselected magnetic fields $B_i$, i=1, 2, . . . , I, and for each $B_i$:

(a) measuring the Hall coefficient $R_{H(i)}$ and electrical resistivity $\rho_i$ corresponding to the $B_i$;

(b) using the $R_{Hi}$, the $\rho_i$, and the $B_i$ to determine elements $\sigma_{xx(i)}$ and $\sigma_{xy(i)}$ of the conductivity tensor of the sample at the $B_i$;

(c) using the $\sigma_{xx(i)}$ and $\sigma_{xy(i)}$ to make estimates of the magnitudes $S_{xx(i)}$ and $S_{xy(i)}$ of the conductivity-mobility spectrum of the sample;

wherein the method further includes:

using the $B_i$'s, the $\sigma_{xx(i)}$'s, and $\sigma_{xy(i)}$'s, and the estimates of $S_{xx(i)}$ and $S_{xy(i)}$ for mathematically iterating the values of $S_{xx(i)}$ and $S_{xy(i)}$;

wherein the iterating comprises recursively iterating the $S_{xx(i)}$ and $S_{xy(i)}$ according to:

$$S_i^{xx}(k+1) =$$

$$(1+\mu_i^2B_i^2)\left[\sigma_{xx}^{exp}(B_i) - \sum_{j=1}^{i-1}\frac{S_j^{xx}(k+1)}{1+\mu_j^2B_i^2} - \sum_{j=i+1}^{m}\frac{S_j^{xx}(k)}{1+\mu_j^2B_i^2}\right]$$

$$S_i^{xy}(k+1) =$$

$$\frac{(1+\mu_i^2B_i^2)}{\mu_iB_i}\left[\sigma_{xy}^{exp}(B_i) - \sum_{j=1}^{i-1}\frac{S_j^{xy}(k+1)\mu_jB_i}{1+\mu_j^2B_i^2} - \sum_{j=i+1}^{m}\frac{S_j^{xy}(k)\mu_jB_i}{1+\mu_j^2B_i^2}\right]$$

where $\mu_i$ is the ith mobility point.

4. The method of claim 3, wherein the iterating is further done effective to cause, upon any value of the $S_{xx(i)}$ becoming negative, the $S_{xx(i)}$ to be reset to a preselected non-negative value.

5. A method comprising:

providing an isotropic sample of semiconductor material;

sequentially exposing the sample to a plurality I of preselected magnetic fields $B_i$, i=1, 2, . . . , I, and for each $B_i$:

(a) measuring the Hall coefficient $R_{H(i)}$ and electrical resistivity $\rho_i$ corresponding to the $B_i$;

(b) using the $R_{H(i)}$, the $\rho_i$, and the $B_i$ to determine elements $\sigma_{xx(i)}$ and $\sigma_{xy(i)}$ of the conductivity tensor of the sample at the $B_i$;

(c) using the $\sigma_{xx(i)}$ and $\sigma_{xy(i)}$ to make estimates of the magnitudes $S_{xx(i)}$ and $S_{xy(i)}$ of the conductivity-mobility spectrum of the sample;

wherein the method further includes:

using the $B_i$'s, the $\sigma_{xx(i)}$'s, and $\sigma_{xy(i)}$'s, and the estimates of $S_{xx(i)}$ and $S_{xy(i)}$ for mathematically iterating the values of $S_{xx(i)}$ and $S_{xy(i)}$;

wherein the iterating includes recursively iterating the $S_{xx(i)}$ and $S_{xy(i)}$ according to:

$$S_i^{xx}(k+1) = (1-\omega_x)S_i^{xx}(k) + \omega_x\left[(1+\mu_i^2B_i^2)\left[\sigma_{xx}^{exp}(B_i) - \sum_{j=1}^{i-1}\frac{S_j^{xx}(k+1)}{1+\mu_j^2B_i^2} - \sum_{j=i+1}^{m}\frac{S_j^{xx}(k)}{1+\mu_j^2B_i^2}\right] - S_i^{xx}(k)\right]$$

$$S_i^{xy}(k+1) = (1-\omega_x)S_i^{xy}(k) + \omega_x\left[\frac{(1+\mu_i^2B_i^2)}{\mu_iB_i}\left[\sigma_{xy}^{exp}(B_i) - \sum_{j=1}^{i-1}\frac{S_j^{xy}(k+1)\mu_jB_i}{1+\mu_j^2B_i^2} - \sum_{j=i+1}^{m}\frac{S_j^{xy}(k)\mu_jB_i}{1+\mu_j^2B_i^2}\right] - S_i^{xy}(k)\right]$$

where $\omega_x$ and $\omega_y$ are damping parameters selected to be between 0 and 1 and where $\mu_i$ is the ith mobility point.

6. The method of claim 5 wherein:

The limits of the mobilities of the maximum and minimum mobility points which may be considered are extended by interpolation of experimental data to magnetic fields $B<B_{min}$ to extend the high-mobility limit and through extrapolation to magnetic fields $B>B_{max}$ to extend the low-mobility limit, where $B_{min}$ and $B_{max}$ are the minimum and maximum magnetic fields respectively.

7. the method of claim 6 wherein:

The extrapolation to higher magnetic fields is accomplished by assuming at $B>B_{max}$, $\sigma_{xx}(B)$ and $\sigma_{xy}(B)$ have functional forms consistent with $$\sigma_{xx}(B) = \sum_{i=1}^{m}\frac{n_ie\mu_i}{1+\mu_i^2B^2}$$

$$\sigma_{xy}(B) = \sum_{i=1}^{m}\frac{S_in_ie\mu_i^2B}{1+\mu_i^2B^2}$$

and which satisfy the condition that they smoothly join the magnitudes and first derivatives of the experimental conductivity tensor components at $B_{max}$.

* * * * *